(12) United States Patent
Straeussnigg et al.

(10) Patent No.: US 9,735,795 B2
(45) Date of Patent: Aug. 15, 2017

(54) ANALOG-TO-DIGITAL CONVERTER ARRANGEMENT

(71) Applicant: Infineon Technologies AG, Neubiberg (DE)

(72) Inventors: Dietmar Straeussnigg, Villach (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/078,499

(22) Filed: Nov. 12, 2013

(65) Prior Publication Data
US 2014/0132433 A1 May 15, 2014

(30) Foreign Application Priority Data
Nov. 9, 2012 (DE) .................. 10 2012 110 737

(51) Int. Cl.
| H03M 1/00 | (2006.01) |
|---|---|
| H03M 1/06 | (2006.01) |
| H03M 1/08 | (2006.01) |
| H03M 1/18 | (2006.01) |

(52) U.S. Cl.
CPC ........ H03M 1/0626 (2013.01); H03M 1/0863 (2013.01); H03M 1/186 (2013.01)

(58) Field of Classification Search
CPC ........ H03M 1/185; H03M 1/12; H03M 1/183; H03M 1/18; H03M 1/1009; H03M 1/462; H03M 3/49; H03M 1/1076; H03M 1/181
USPC ................. 341/118, 120, 132, 139, 142, 155
See application file for complete search history.

(56) References Cited

U.S. PATENT DOCUMENTS

| 4,851,842 A * | 7/1989 | Iwamatsu ............ H03M 1/0639 330/144 |
|---|---|---|
| 5,808,575 A * | 9/1998 | Himeno .............. H03M 1/0863 341/139 |
| 5,844,512 A | 12/1998 | Gorin et al. |
| 6,002,352 A * | 12/1999 | El-Ghoroury ......... H03M 1/208 341/139 |
| 6,292,120 B1 * | 9/2001 | Painchaud ............ H03M 1/185 341/139 |
| 7,254,198 B1 * | 8/2007 | Manickam ........ H04L 25/03057 375/233 |
| 7,327,294 B2 | 2/2008 | Gierenz et al. |
| 7,463,170 B2 * | 12/2008 | Kong ..................... G10L 19/18 341/61 |
| 7,541,952 B1 * | 6/2009 | Sankaran ............ H03M 1/1028 341/117 |
| 8,605,836 B2 * | 12/2013 | Murthy ................ H03G 3/3068 375/345 |
| 2003/0083031 A1 * | 5/2003 | Eriksson .............. H03G 1/0023 455/250.1 |
| 2005/0052299 A1 * | 3/2005 | Oliaei ................... H03M 3/344 341/143 |
| 2006/0071835 A1 * | 4/2006 | Inukai ......................... 341/143 |
| 2006/0222118 A1 * | 10/2006 | Murthy ................ H03G 3/3068 375/345 |
| 2007/0205922 A1 * | 9/2007 | Itakura et al. .................. 341/50 |

(Continued)

Primary Examiner — Linh Nguyen
(74) Attorney, Agent, or Firm — Harrity & Harrity, LLP

(57) ABSTRACT

An analog-to-digital converter arrangement may include an analog amplifier with variable gain; an analog-to-digital converter; a digital reconstruction element including elements to reduce an influence of transients during a change of the variable gain of the analog amplifier.

20 Claims, 6 Drawing Sheets

(56) References Cited

U.S. PATENT DOCUMENTS

| | | | |
|---|---|---|---|
| 2007/0293180 A1* | 12/2007 | Rahman et al. | 455/296 |
| 2008/0014889 A1 | 1/2008 | Homer et al. | |
| 2008/0218395 A1* | 9/2008 | Tomioka | H03M 1/202 341/155 |
| 2009/0079611 A1* | 3/2009 | Hwang | H03M 1/18 341/155 |
| 2011/0033013 A1 | 2/2011 | Fifield | |
| 2013/0271307 A1* | 10/2013 | Kropfitsch | H03G 3/002 341/158 |

* cited by examiner

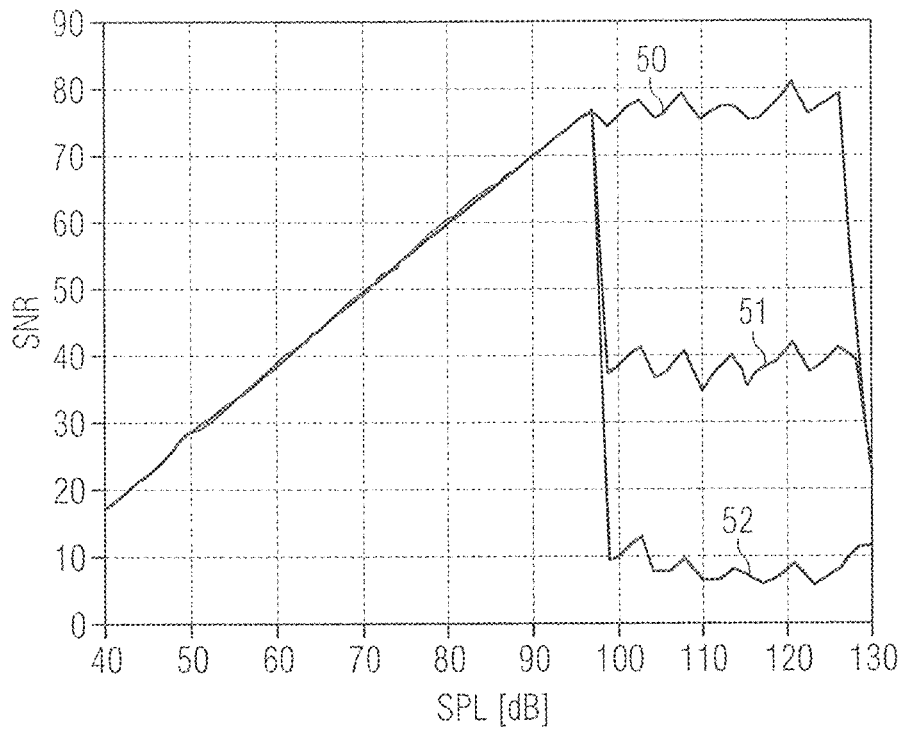
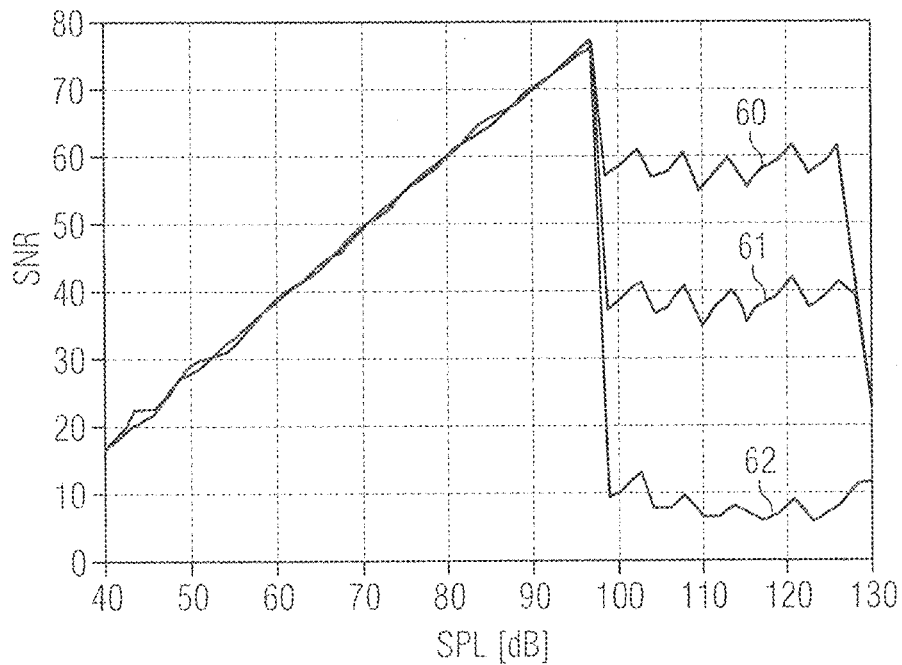

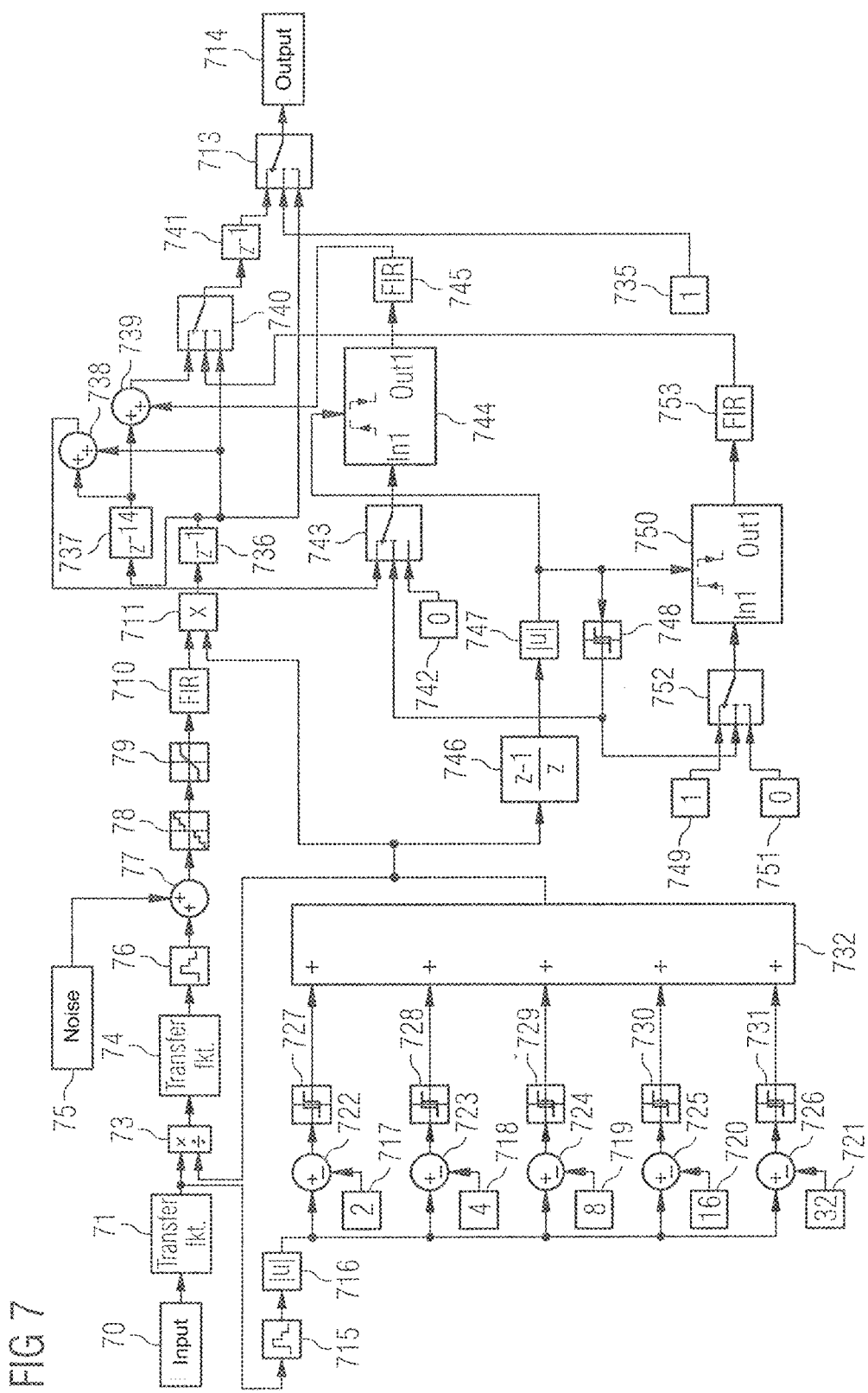

ANALOG-TO-DIGITAL CONVERTER ARRANGEMENT

RELATED APPLICATIONS

This Application claims priority benefit of German Patent Application 102012110737.8, which was filed on Nov. 9, 2012. The entire contents of the German Patent Application are incorporated herein by reference.

BACKGROUND

This disclosure relates to analog-to-digital converter arrangement in which an analog signal is converted into a digital signal, and to corresponding methods.

In many applications, analog signals such as analog signals delivered by a sensor, are converted into digital signals and then be processed digitally. A dynamic range of an implemented analog-to-digital converter (A/D) converter may be designed, for example, to handle a maximum value range of an input signal, whereby signal levels associated with the A/D have an optimized signal-to-noise ratio (SNR).

In some applications, however, it is not necessary that the SNR is correlated with an increasing signal level. This is the case, for example, in some applications, such as microphones that are used as signal sources for analog signals. In some applications associated with microphones, certain noise levels exhibit an SNR that stays the same or decreases, without incurring problems at some future time when signals are used. In such applications, adapting an appropriate A/D converter to the maximum range of values with a corresponding curve of the SNR is achieved only with considerable overhead. Such overhead includes having to use an A/D that requires significant implementation area and creates large power dissipation. Furthermore, it may be difficult to provide an appropriate A/D converter for some applications, for example, for microphones having high sound levels, for example, sound levels up to 140 dB sound pressure level (SPL).

Therefore, it may be desirable to provide A/D arrangements and corresponding methods, which enable for example, efficient analog-to-digital conversion of analog signals, such as microphone signals, with a reduced overhead.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

FIG. 5 illustrates a simulation related to the detailed block diagram illustrated in FIG. 4.

FIG. 6 illustrates another simulation related to the detailed block diagram illustrated in FIG. 4.

FIG. 7 illustrates a detailed block diagram of an apparatus associated with at least one embodiment.

DETAILED DESCRIPTION

Figure 1:
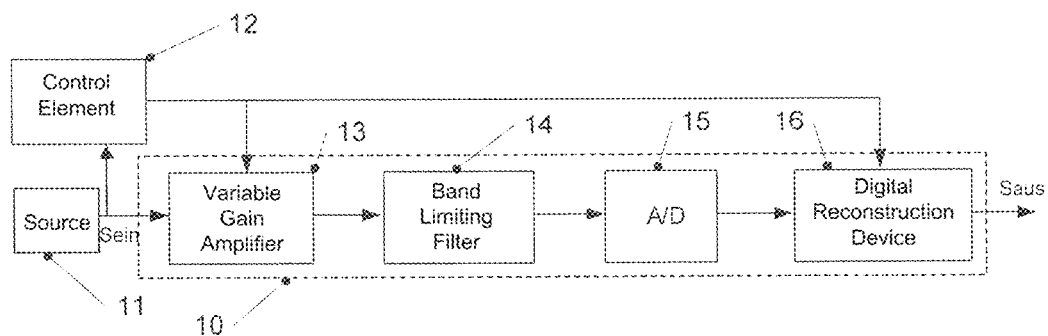
FIG. 1 illustrates a block diagram of an apparatus according to one embodiment.

Exemplary embodiments are described in greater detail with reference to the figures. The invention is not limited to the specifically described embodiments but can be suitably modified and altered. Individual features and feature combinations of one embodiment can be customized with features and feature combinations of other one or more embodiments, unless this is expressly excluded.

Before the following embodiments with reference to the figures are explained in detail, it should be noted that matching elements are provided in the figures with matching or similar reference numerals. In some cases, the description of such matching or similar reference numerals will not repeated. In addition, the figures are not necessarily shown to scale, since their focus is on the illustration and explanation of basic principles.

The method described and the operations or events shown are not necessarily executed in the order shown, but in other embodiments, other orders and/or concurrently performing various operations or events are possible.

In embodiments, an analog signal is amplified by an analog variable gain amplifier and then supplied to an analog-to-digital converter. After the analog-to-digital converter, a digital amplification of the signal takes place with variable gain. In embodiments, the gain of the analog amplifier and a signal strength of an analog signal may be adjusted, for example, so that the analog-to-digital converter is not overdriven. The gain of the digital amplifier can then also be adapted so that a total or overall gain of the analog and the digital amplifier is the same. In this case, the effects of transients which are generated in a change in the gain of the analog signal can be reduced in various ways, for example by filtering, interpolation and/or repetition of signals.

FIG. 1 shows a block diagram of an embodiment of an analog-to-digital converter arrangement 10. The analog-to-digital converter arrangement 10 receives an input signal "Sein" from a source 11. The source 11 may for example comprise a sensor which produces analog signals, such as a microphone. Furthermore, the source 11 may comprise further elements, which process the signals generated by the sensor, for example, converting current signals into voltage signals, or vice versa, filters signals, or the like.

The signal from the source 11 is provided to a variable analog amplifier 13 of the analog-to-digital converter arrangement 10. The variable analog amplifier 13 may be a variable analog amplifier with modifiable or variable gain. A signal provided by the variable gain amplifier 13 is received by a band limiting filter 14, which may for example be configured as a low pass filter that reduces aliasing effects associated with signals received thereby. It should be noted that the band limiting filter 14 may be implemented as a particular low pass filter. Alternatively, the filtering influences provided by the band limiting filter 14 may also be a result of intrinsic properties of the used components of the analog-to-digital converter arrangement 10. Therefore, in one example, a band limiting filter 14 may not be particularly implemented in the analog-to-digital converter arrangement 10.

The band-limited amplified analog signal provided by the band limiting filter 14 is supplied to an analog to digital converter 15. The analog-to-digital converter 15 may be any conventional type of analog-to-digital converter. Example analog-to-digital converters include flash converters, feedback transducer such as a so-called trailing transducer or transducers, converters based on successive approximation techniques and delta-sigma converters.

A signal generated by the analog-to-digital converter 15 may be provided to a digital reconstruction device 16. In some embodiments, the digital reconstruction device 16 may apply a gain to the digital signal provided by the analog-to-digital converter 15. In addition, in the digital reconstruction device 16, measures may be taken to mitigate effects of transients associated with the signals received thereby. Such transients may be associated with or caused by the variable gain amplifier 13, the band limiting filter 14, or other related elements of the analog-to-digital converter arrangement 10.

The illustrated embodiment further provides a control element 12. The control element 12 is provided to control a gain of the variable amplifier 13 and a gain of the digital reconstruction device 16, such that an overall amplification associated with the digital to analog converter arrangement 10 will remain constant or approximately constant. In other words, the control element 12 is provided so that an output signal "Saus" is amplified using a constant gain, relative to the input signal Sein. In other embodiments, a total gain can be changed by way of at least the control element 12 and the associated elements of the analog-to-digital converter arrangement 10.

A gain of the variable amplifier 13 (and hence the digital reconstruction device 16 in cases where the total gain is the same) may be controlled using a signal supplied by the control element 12. The control element 12 may adjust the gain of the variable amplifier 13 to a range of values associated with the analog-to-digital converter 15, in particular, such that the analog-to-digital converter 15 is not overdriven. This may be referred to as compression of the signal path. The corresponding gain in the digital reconstruction device 16 is then accordingly called decompression. In particular, by way of such offsetting gains, the analog-to-digital converter 15 may be made smaller, for example, the analog-to-digital converter 15 may have a lower input value range and/or a smaller number of bits compared to an analog-to-digital converter that must always process a whole value range of an input signal with a fixed gain.

It should be noted that a gain may be less than 1, i.e. provide effective attenuation of the signal. For example, when an output level of the signal Sein is too large to be properly processed by the analog-to-digital converter 15, the variable amplifier 13 may function to attenuate the signal Sein so that it is compatible with the input range of the analog-to-digital converter 15.

In addition to the foregoing, it should be understood that the control element 12 must not directly receive the input signal Sein. Furthermore, it should be understood that the control element 12 may control the variable gain amplifier 13 and/or the digital reconstruction device 16 based on a signal other than the input signal Sein. Such a signal may be a derivative or derivation of the input signal Sein. Furthermore, such signal may also be derived from an output of the analog-to-digital converter 15, another digital signal, or the output signal Saus. Furthermore, such as signal may be an integrated signal that indicates a measure of signal strength there from. In some embodiments, such a signal may include information relating to the signal strength of a separate sensor. Therefore, various signals and information thereof may be used to control the gain of the variable gain amplifier 13 and/or the digital reconstruction device 16.

Figure 2:
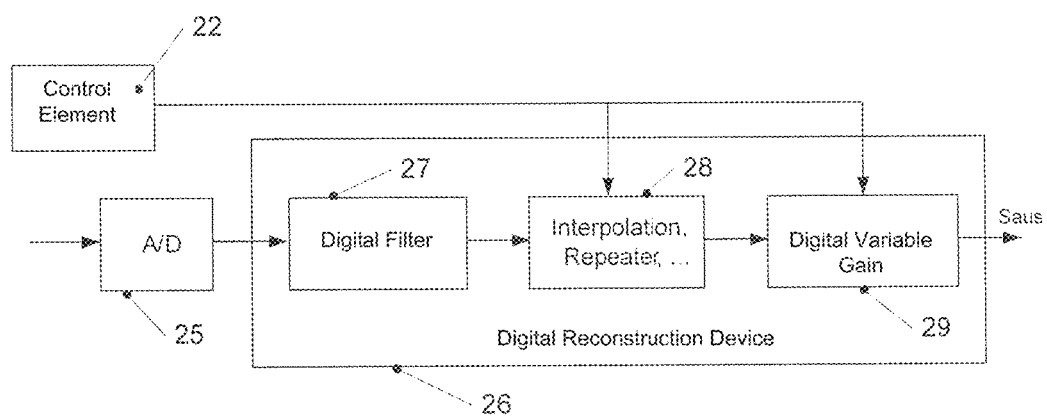
FIG. 2 illustrates a block diagram of a portion of an apparatus associated with at least one embodiment.

FIG. 2 illustrates a portion of an apparatus in accordance with an embodiment. In particular, a digital reconstruction device 26 is provided in greater detail in FIG. 2. In one particular embodiment, the digital reconstruction device 26 and its associated elements is the same as the digital reconstruction device 16. The digital reconstruction device 26 is functional to receive a digital signal from an analog-to-digital converter 25. The digital reconstruction device 26 may be controlled by a control element 22. The control element 22 may correspond to the control element 12, where the analog-to-digital converter 25 may correspond to the analog-to-digital converter 15.

The digital reconstruction device 26 may include a digital filter 27, which receives and filters digital signals from the analog-to-digital converter 25. The digital filter 27, for example, may be a finite impulse response (FIR) filter. The digital filter 27 may function to eliminate transients associated with the digital signal provided by the analog-to-digital converter 25. These transients may be partially or completely generated by a variable gain amplifier, such as the upstream variable gain amplifier 13. The actual length of the transients may depend on a time constant associated with one or more poles of a filter, such as the band limiting filter 14.

An interpolation and repeater device 28 is provided downstream of the digital filter 27. The interpolation and repeater device 28 may be activated by the control element 22 during a gain change process provided by the control element 22. In particular, and the interpolation and repeater device 28 may be controlled by the control element 22 during a gain change process of the variable gain amplifier 13 and the digital reconstruction device 16/26. In one example, the interpolation and repeater device 28 functions to reconstruct one or more portions of a signal provided by the digital filter 27. That is, reconstruction may be required because of caused by the digital filter 27 and/or other elements in the system.

Downstream of the interpolation and repeater device 28 is a digital variable gain element 29. The digital variable gain element 29 may be controlled by the control element 22. That is, the digital variable gain element 29 may be controlled by the control element 22 in response to a change of gain associated with the analog-to-digital converter 25. More specifically, the digital variable gain element 29 may be controlled by the control element 22 to ensure that the total gain of the system remains substantially constant. One advantage of the embodiments illustrated in FIGS. 1 and 2 is that transients suppressed by the digital filter 27 and the interpolation and repeater device 28 generally improve the overall SNR of the system. Moreover, the embodiments enable the design and use of a smaller analog-to-digital converter 15/25.

In some embodiments, it is possible to eliminate the digital filter 27. In such a case, the interpolation and repeater device 28 is to receive digital signals directly or indirectly from the analog-to-digital converter 25. In another example, the interpolation and repeater device 28 may be eliminated. In yet other examples, other arrangements of the elements 27 and 29 are possible. In one such example, the digital variable gain element 29 is positioned downstream of the digital filter 27, and the interpolation and repeater device 28 is positioned downstream of the variable gain element 29. Therefore, it is not compulsory to order the elements 27-29 as illustrated in FIG. 2.

Figure 3:
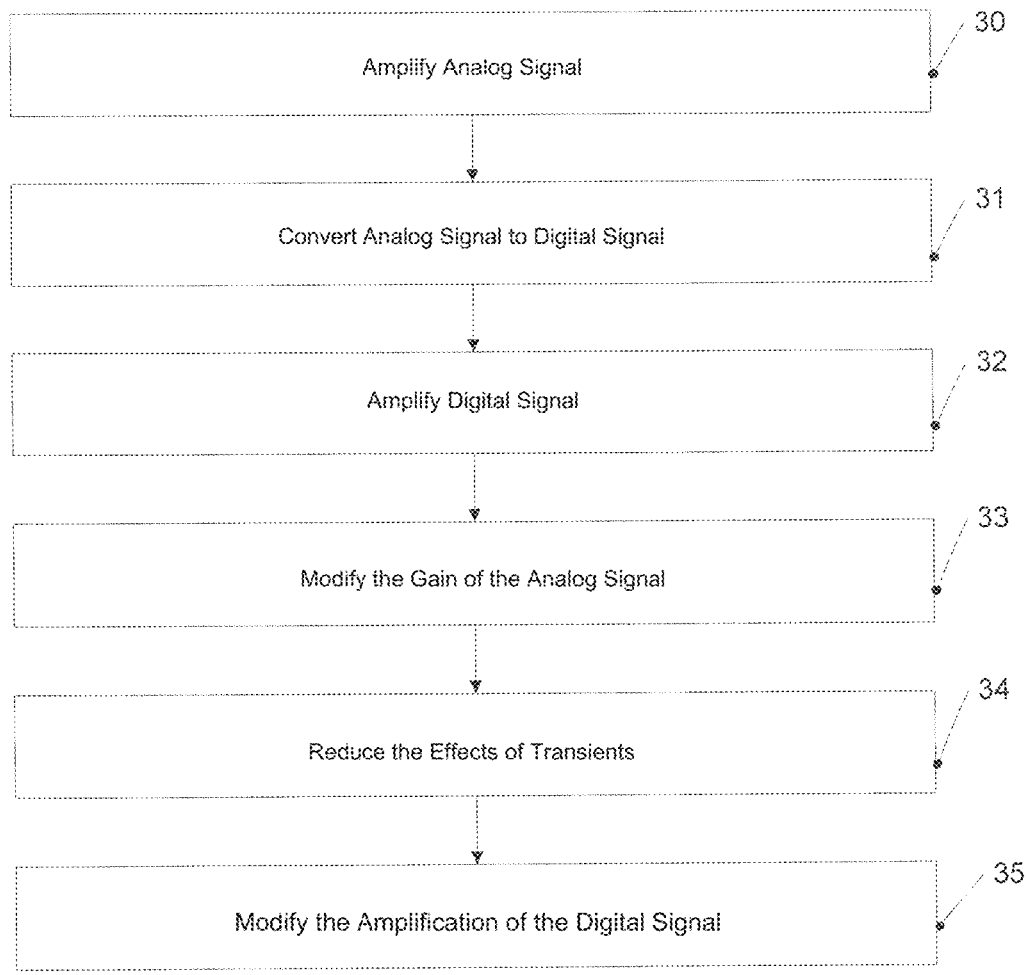
FIG. 3 illustrates a flow diagram associated with the method of at least one embodiment.

FIG. 3 illustrates a flow diagram of the method according to one embodiment. The illustrated a method may be implemented by the apparatuses illustrated in one or more of FIGS. 1 and 2. Furthermore, the method may be implemented by other apparatuses described in this disclosure, as well as other apparatuses that may not be particularly described herein.

At block 30, an analog signal, for example an output signal from a sensor such as a microphone, is amplified. At block 31, the amplified analog signals are converted to digital signals. At block 32, the digital signal may be amplified. However, digital signals having very low signal levels must not undergo amplification, or may be amplified with a gain corresponding to 1.

At block 33, the gain of the analog signal is changed, which may create one or more transients in the analog signal. In one example, a signal level of the analog signal is increased, so that an input range of an analog-to-digital converter used at block 31 is exceeded. In one example, the gain of the analog signal may rather be reduced. At block 34, the effects of the transients may be mitigated or reduced. For example, the transients mitigation may be accomplished using digital filtering, interpretation and/or repetition of a signal sequence occurring before or after one or more of the transients. At block 35, an amplification or gain of the digital signal is modified, such that a total gain associated with one or more elements of a system remains constant. In one example, modifying the amplification or gain of the digital signal considers the gain or amplification of the analog signal and the gain or amplification of the digital signal.

Figure 4:
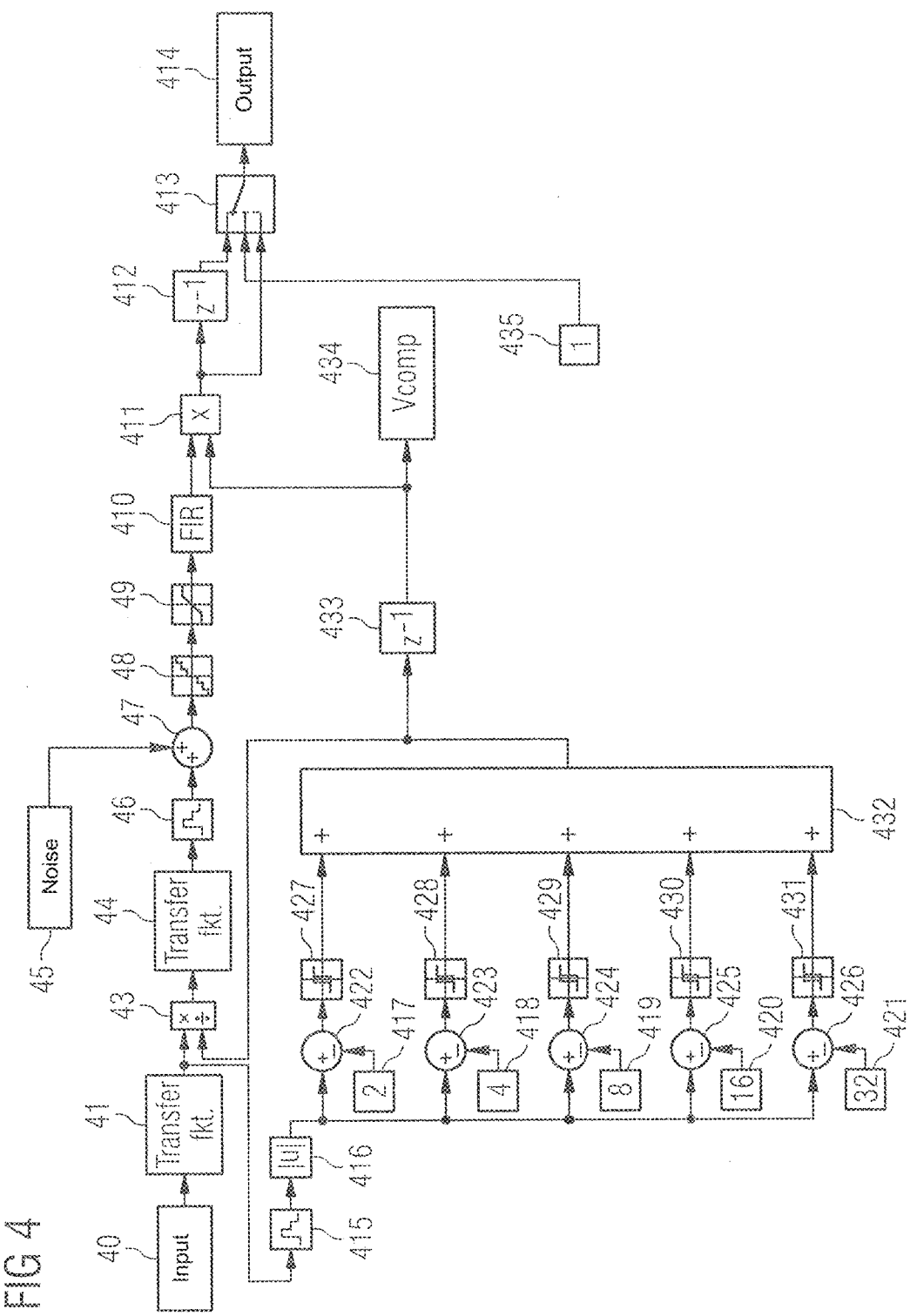
FIG. 4 illustrates a detailed block diagram of an apparatus associated with at least one embodiment.

FIG. 4 illustrates a block diagram of another embodiment. The schematic apparatus illustrated in FIG. 4 will be discussed in connection with the simulation representations illustrated in FIGS. 5 and 6. The block diagram illustrated in FIG. 4 provides reduction of the effects of transients by way of the use of a digital filter 410, without further measures, such as by way of interpolation or repetition of signal values.

An input signal associated with an input 40, for example from a source comprising a sensor such as a microphone, is supplied to a multiplier represented as analog amplifier 43. A transfer function 41 may be disposed between the input 40 and the analog amplifier 43. An amplification, in particular represented by the division mark of the amplification element 43 is determined by elements 415-432, described later. The amplified signal is supplied to a quantizer 48 that is an analog-to-digital converter. Another transfer function 44 and zero order hold element 46 are disposed upstream of the quantizer 48. An adder 47 is disposed downstream of the zero order hold element 46. The adder 47 receives noise from a noise element 45 and adds the noise to the signal provided by the zero order hold element 46.

Downstream of the quantizer 48 is a saturation element 49 and a digital filter 410, which has a finite impulse response of the first order. The function of the foregoing elements is to change a length of one or more transients. This change in the length (e.g., shortening) of one or more transients may be achieved by modifying the gain of the analog amplifier 43. Downstream of the digital filter 410 is a multiplier 411, which is also considered a digital amplifier. As is illustrated, the multiplier 411, via a delay element 433, receives the same amplification or gain as the amplification element 43. This particular arrangement ensures that the gain of the entire system remains equal and/or unchanged. The delay element 433 is used to compensate for the signal flow through elements 44, 46, 47, 48, 49 and 410. The output from the delay element 433 may also be provided to a Vcomp element 434.

The signal amplified by the multiplier 411 may be provided directly to a switch 413, or to the switch 413 via a delay element 412. Furthermore, switch may be coupled to a testing port 435. The switch 413 is coupled to an output 414.

Following the transfer function 41, a signal output thereby is also received by a zero order holding element 415, which provides an output to an absolute value unit 416. An output of the absolute value for and 16 is coupled to a plurality of subtractors 422-426. Constants of 2, 4, 8, 16 and 32 are removed from the output of the absolute value unit 416 by way respective subtractors 422-426. Each one of the subtractors 422-426 is coupled to one of elements 427-431. The elements 427-431 each function to check if the difference provided by a respective one of the subtractors 422-426 falls within a particular range. The determinations provided by the elements 427-431 provided to an adder 432. In this way, an absolute value of the input signal of the amplifier is compared with different constant thresholds, and in dependence on these comparisons a corresponding gain factor of the adder 432 is output. The higher the absolute value of the input signal, thereby causing a correspondingly higher signal attenuation in the amplifier 43, generally results in a higher gain in the amplifier 411.

Transients which are generated by changes in the gain will be reduced or mitigated by the digital filter 410.

Simulation results are presented in FIGS. 5 and 6, on the basis of the apparatus of FIG. 4, to illustrate the effect of the embodiment of FIG. 4. In each figure, the y-axis shows the SNR and the x-axis does the SPL [dB].

As is illustrated in FIG. 5, the SNR increases up until approximately 100 dB, or slightly less therefrom. Curve 52 illustrates a dramatic decrease in the SNR occurs at 100 dB, or slightly less than 100 dB. Curve 52 occurs with no compression and decompression of the signal path. That is, curve 52 occurs when no attenuation is provided to a signal being provided to an analog-to-digital converter and when the gain is applied to signal supplied by an analog-to-digital converter.

Curve 1 illustrates a decrease in SNR occurs at 100 dB, or slightly less than 100 dB, but the decrease in SNR is less dramatic than that shown in curve 52. Curve 52 occurs with compression and decompression of the signal path, but no mitigation of transients is provided. For example, the filter 410 illustrated in FIG. 4 is omitted. Finally, the curve 52 occurs with compression and decompression of the signal path and with mitigation of transients being provided.

The curves of FIG. 5 show ideal SNR vs. dB curves. In practice, however, there may, for example, a variation of the base frequency caused by process or temperature variations. FIG. 6 shows curves corresponding to the curves of FIG. 5 for the case that the cut-off frequency varies by 10% from its nominal value. Curve 62 shows the response without compression and decompression, a curve 61 shows the behavior of compression and decompression, however, without a filter, and a curve 60 shows the behavior of compressing and decompressing, and with a corresponding filter. Even if the values of the SNR corresponding to the curve 60 are below those of the curve 50 of FIG. 5, the SNR is still significantly better than in the case without filter.

Another embodiment for which simulations have been performed is illustrated in FIG. 7. Elements 70-711 match 40-411 elements of FIG. 4, items 715-732 of FIG. 7 correspond to elements 415-432 of FIG. 4, and elements 713, 714 and 735 correspond to elements 413, 414 and 435 of FIG. 4. These elements will not be described again here.

As is illustrated in FIG. 7, an interpolation is provided between the switches 713, the output 714 and the digital amplifier. The interpolation circuit includes a delay element 736 coupled downstream of the amplifier 711. A further delay element 737, which for example has a higher delay (10×), is coupled to the delay element 736. A subtractor 738 is provided and receives an output from each of the delay elements 736 and 737. A further subtractor 739 is provided and receives an input from the delay element 737 and a filter 745.

The interpolation circuit further includes switches 743 and 752. The switch 743 is functional to receive and switch a constant 742, an output from it determiner 748 and an output from the subtractor 738. The switch 752 is functional to receive and switch a constant 749, a constant 751, and an output from the determiner 748. The switch 743 supplies an output value therefrom to a triggered subsystem 744. The switch 752 supplies an output value therefrom are triggered subsystem 750. The triggered subsystem 744 is coupled to the filter 745. The triggered subsystem 750 is coupled to a filter 753. These components of the interpolation circuit are connected to each other as shown in FIG. 7. It should be noted that this structure is an only one example of an interpolation circuit, where other interpolation circuits may be implemented. The embodiment of FIG. 7 shows, in particular, a linear interpolation, although other types of interpolation are possible.

As mentioned above repeating values may be used instead of interpolating. For this purpose, for example, a series of signal values of the digitized signal are stored in a memory and are read out again from the memory in the case of the occurrence of a transient rather than the values of the transients. Furthermore, as discussed, the use of both repeating values and interpolation may also be used.

Figure 8:
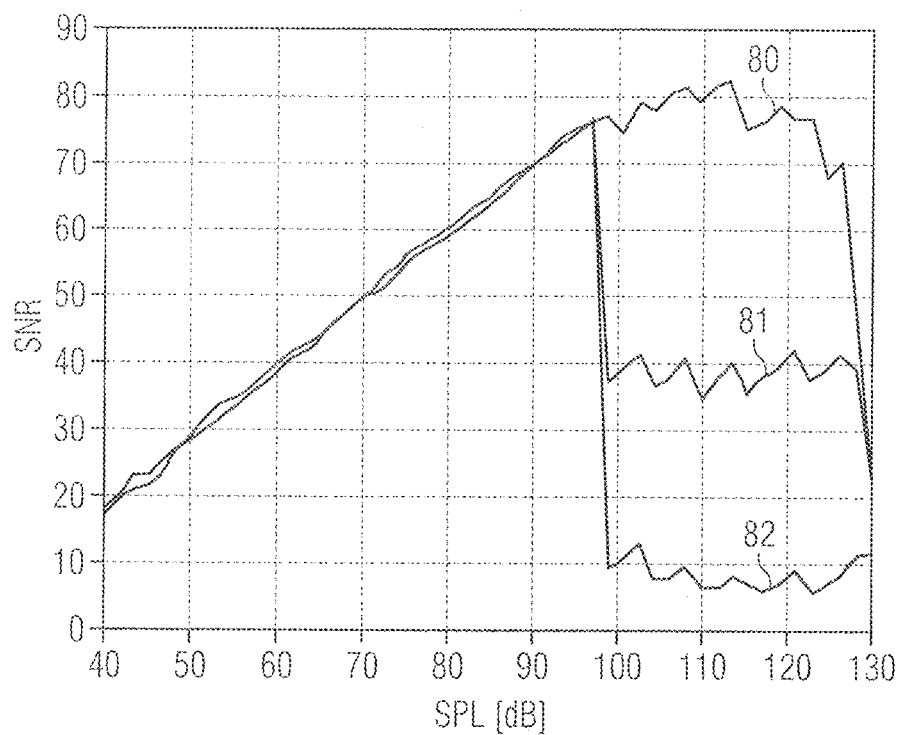
FIG. 8 illustrates a simulation related to the detailed block diagram illustrated in FIG. 7.
Figure 9:
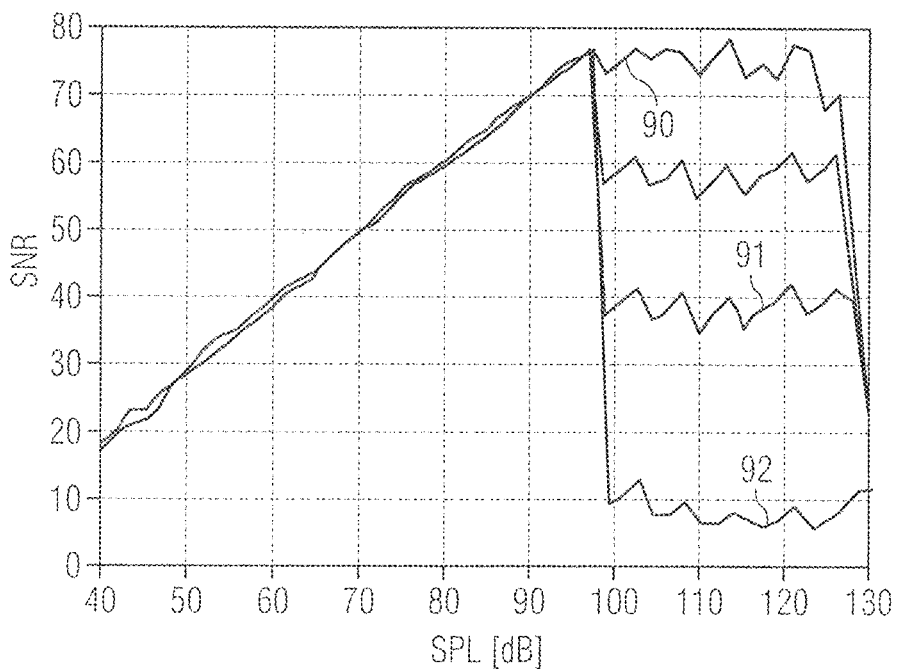
FIG. 9 illustrates another simulation related to the detailed block diagram illustrated in FIG. 7.

In FIGS. 8 and 9 simulations are presented on the basis of the embodiment of the arrangement illustrated in FIG. 7. FIG. 8 shows curves corresponding to those of FIG. 5, i.e. with a nominal cut-off frequency. A curve 82 corresponds to the curve 52 of FIG. 5, i.e. without compression and decompression, and a curve 81 shows use of compression and decompression, without filtering and interpolation, and corresponding to curve 51 of FIG. 5. Finally, the curve 80 shows a simulation for the case with digital filtering and interpolation. In this case, the best SNRs can be achieved at high input signal levels.

FIG. 9 again shows simulations of a case wherein a corner frequency of a band limitation of a nominal value of 10% from the original. A curve 92 again shows the case with no compression and decompression, a curve 91 shows a case of compression and decompression, without filtering and interpolation, and a curve 90 shows a case of compression and decompression, as well as filtering and interpolation. Compared with the case of FIG. 6 is to be noted that, for the additional use of interpolation, hardly a noticeable drop of the SNR is affected by a variation of the base frequency at high signal intensity.

The above simulations are intended to be illustrative, and the exact curves in actual implementations of the illustrated embodiments may deviate from the curves shown depending a particular circuit implementation.

For the purposes of this disclosure and the claims that follow, the terms "coupled" and "connected" have been used to describe how various elements interface. Furthermore, elements and devices described herein may be implemented in hardware or software, or a combination of hardware and software. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

The invention claimed is:

1. An analog-to-digital converter arrangement, comprising:
   an analog amplifier to amplify an analog input signal with a first variable gain;
   an analog-to-digital converter to convert the analog input signal to a digital output signal;
   a digital reconstruction element comprising:
      an interpolation and repeater device to reconstruct a portion of the digital output signal to reduce an influence of transients in the digital output signal, the transients being generated at least in part due to a change to the first variable gain applied by the analog amplifier, and
      a digital amplifier to amplify the digital output signal with a second variable gain; and
   a controller to:
      control, based on the analog input signal, the first variable gain of the analog amplifier, the second variable gain of the digital amplifier, and the interpolation and repeater device.

2. The analog-to-digital converter arrangement of claim 1, where the controller is further to:
   control the interpolation and repeater device to cause the interpolation and repeater device to reduce the influence of the transients.

3. The analog-to-digital converter arrangement of claim 1, where the controller is further to:
   adjust the second variable gain of the digital amplifier to maintain an overall gain, associated with the analog amplifier and the digital amplifier, that is substantially constant.

4. The analog-to-digital converter arrangement of claim 1, where the controller is further to:
   control the first variable gain and the second variable gain further based on a signal including information relating to a signal level of the analog input signal.

5. The analog-to-digital converter arrangement of claim 1, where the digital reconstruction element includes a digital filter.

6. The analog-to-digital converter arrangement of claim 5, where the digital filter is a first order finite impulse response filter.

7. The analog-to-digital converter arrangement of claim 1, where the interpolation and repeater device, when reconstructing the portion of the digital output signal, is to:
   interpolate at least one signal value, associated with the digital output signal, during an occurrence of a transient associated with the analog-to-digital converter arrangement.

8. The analog-to-digital converter arrangement of claim 7, where the interpolation and repeater device includes a digital filter.

9. The analog-to-digital converter arrangement of claim 1, where the interpolation and repeater device, when reconstructing the portion of the digital output signal, is to:

repeat one or more signal portions that occur before a transient associated with the analog-to-digital converter arrangement.

10. The analog-to-digital converter arrangement of claim 1, where the analog-to-digital converter is a successive approximation analog-to-digital converter.

11. The analog-to-digital converter arrangement of claim 1, where the analog-to-digital converter is a sigma delta analog-to-digital converter.

12. The analog-to-digital converter arrangement of claim 1, further comprising:
a low pass filter upstream of the analog-to-digital converter.

13. The analog-to-digital converter arrangement of claim 1, further comprising:
a signal source upstream of the analog-to-digital converter arrangement.

14. The analog-to-digital converter arrangement of claim 13, where the signal source is a microphone.

15. A method to provide analog to digital conversion, the method comprising:
amplifying an analog signal with a first variable gain;
converting the amplified analog signal to a digital signal;
changing the first variable gain of the analog signal,
the changing of the first variable gain of the analog signal being based on information associated with the analog signal;
reducing an influence of at least one transient in the digital signal,
the at least one transient being generated at least in part due to the changing of the first variable gain of the analog signal, and
the reducing the influence of the at least one transient in the digital signal comprising:
reconstructing a portion of the digital signal associated with the at least one transient,
the reconstructing being performed by an interpolation and repeater device of a digital reconstruction element, and
filtering the digital signal in a digital domain;
amplifying the digital signal with a second variable gain; and
changing, based on the information associated with the analog signal, the second variable gain of the digital signal.

16. The method of claim 15, where the changing of the second variable gain of the digital signal causes an overall gain, associated with amplifying the analog signal and amplifying the digital signal, to remain substantially constant.

17. The method of claim 15, where the reconstructing the portion of the digital signal includes using interpolation to reconstruct the portion of the digital signal.

18. The method of claim 15, where the reconstructing the portion of the digital signal includes repeating a signal value to reconstruct the portion of the digital signal.

19. The method of claim 15, where the analog signal is provided by a microphone.

20. The method of claim 15, where the filtering in the digital domain is performed by a first order finite impulse response filter.

* * * * *